(12) United States Patent
Xia et al.

(10) Patent No.: US 10,142,141 B2
(45) Date of Patent: Nov. 27, 2018

(54) METHOD AND APPARATUS OF TRANSMITTING SIGNAL

(71) Applicant: SHENZHEN GOODIX TECHNOLOGY CO., LTD., Shenzhen (CN)

(72) Inventors: Rongjun Xia, Shenzhen (CN); Guangming Zhuo, Shenzhen (CN)

(73) Assignee: SHENZHEN GOODIX TECHNOLOGY CO., LTD., Shenzhen (CN)

(*) Notice: Subject to any disclaimer, the term of this patent is extended or adjusted under 35 U.S.C. 154(b) by 0 days.

(21) Appl. No.: 15/717,931

(22) Filed: Sep. 27, 2017

(65) Prior Publication Data

US 2018/0041366 A1 Feb. 8, 2018

Related U.S. Application Data

(63) Continuation of application No. PCT/CN2016/093511, filed on Aug. 5, 2016.

(51) Int. Cl.
*H04L 27/14* (2006.01)
*H04L 27/06* (2006.01)
(Continued)

(52) U.S. Cl.
CPC .............. *H04L 27/066* (2013.01); *H03K 7/08* (2013.01); *H03M 5/12* (2013.01); *H04B 1/385* (2013.01);
(Continued)

(58) Field of Classification Search
CPC ..... H04L 27/1563; H04L 27/14; H04L 27/02; H04L 27/20; H04L 27/12
(Continued)

(56) References Cited

U.S. PATENT DOCUMENTS

| 5,166,952 A | 11/1992 | Omura et al. |
| 2008/0159430 A1* | 7/2008 | Steer .................. H04L 27/3483 375/267 |

(Continued)

FOREIGN PATENT DOCUMENTS

| CN | 104284268 A | 1/2015 |
| CN | 105635878 A | 6/2016 |
| CN | 105769158 A | 7/2016 |

OTHER PUBLICATIONS

International Search Report for International Application No. PCT/CN2016/093511, Applicant: Shenzhen Goodix Technology Co., Ltd., May 2, 2017, 4 pages.

*Primary Examiner* — Kevin Kim

(57) ABSTRACT

The present disclosure discloses a method of transmitting a signal, a wearable communication device and a terminal device. The method includes: receiving, by a wearable communication device, a modulated wave signal transmitted by a terminal device; demodulating the modulated wave signal to obtain a to-be-decoded signal; performing a waveform shaping process on the to-be-decoded signal to obtain a square wave signal, where a high level in the square wave signal is configured to represent a first preset value, and a time interval is existed between two high levels corresponding to any two adjacent first preset values; acquiring time interval eigenvalues in the square wave signal; acquiring a one-to-one mapping relation of the interval eigenvalues and a plurality of coding sequences; and performing, according to the time interval eigenvalues and the mapping relation, a first decoding process and a second decoding process on the square wave signal to obtain original data.

18 Claims, 9 Drawing Sheets

(51) Int. Cl.
*H04L 27/00* (2006.01)
*H04R 1/10* (2006.01)
*H03K 7/08* (2006.01)
*H03M 5/12* (2006.01)
*H04B 1/3827* (2015.01)
*H04L 25/02* (2006.01)
*H04L 25/03* (2006.01)
*H04R 5/04* (2006.01)
*H03K 5/156* (2006.01)
*H04L 27/02* (2006.01)
*H04L 27/10* (2006.01)
*H04L 27/18* (2006.01)
*H04R 5/033* (2006.01)

(52) U.S. Cl.
CPC .... *H04L 25/0286* (2013.01); *H04L 25/03834* (2013.01); *H04L 27/0002* (2013.01); *H04L 27/06* (2013.01); *H04R 1/1091* (2013.01); *H04R 5/04* (2013.01); *H03K 5/156* (2013.01); *H04L 27/02* (2013.01); *H04L 27/10* (2013.01); *H04L 27/18* (2013.01); *H04R 5/033* (2013.01)

(58) Field of Classification Search
USPC .................................. 375/268.3, 268, 300
See application file for complete search history.

(56) References Cited

U.S. PATENT DOCUMENTS

| | | |
|---|---|---|
| 2009/0149202 A1 | 6/2009 | Hill et al. |
| 2010/0329372 A1* | 12/2010 | Grewing ............. H04L 27/0014 375/260 |
| 2011/0301435 A1 | 12/2011 | Albert et al. |
| 2011/0301439 A1 | 12/2011 | Albert et al. |
| 2012/0172689 A1 | 7/2012 | Albert et al. |
| 2013/0331663 A1 | 12/2013 | Albert et al. |
| 2014/0221859 A1 | 8/2014 | Albert |
| 2014/0228665 A1 | 8/2014 | Albert |
| 2015/0073285 A1 | 3/2015 | Albert et al. |
| 2016/0235319 A1 | 8/2016 | Albert |
| 2017/0264728 A1 | 9/2017 | Lu et al. |

* cited by examiner

METHOD AND APPARATUS OF TRANSMITTING SIGNAL

CROSS REFERENCE TO RELATED APPLICATIONS

The present application is a continuation of international application No. PCT/CN2016/093511, filed on Aug. 5, 2016, which is hereby incorporated by reference in its entirety.

TECHNICAL FIELD

Embodiments of the present disclosure relates to the field of information technologies, and in particular, to a method and an apparatus of transmitting a signal.

BACKGROUND

With thriving Internet of Things (IoT), the conventional earphone field has also changed, and in addition to a play function, intelligence characteristics of an information exchange such as a heart rate detection, a step recording and the like are gradually added.

At present, it is known a wired earphone that can perform a communication transmission via an audio signal path corresponding to a host side and an earphone interface. A main communication procedure is as follows: (1) a terminal device encodes and modulates data that needs to be transmitted to an earphone; (2) the terminal device performs a digital-to-analog conversion on a modulated signal; (3) the terminal device transmits the modulated signal after the digital-to-analog conversion to the earphone through a left channel line or a right channel line of an earphone cable connected to the earphone interface; and (4) the earphone demodulates and decodes a received signal. In this procedure, on the one hand, a signal is transmitted by a channel line (for example, the left channel line or the right channel line), and it is necessary to recover a carrier by a carrier recovering module at the receiving end, to perform a signal demodulation. A conventional carrier recovery usually employs a phase-locked loop circuit and the like; on the other hand, it is also necessary to decode the signal through a digital circuit. Therefore, a digital circuit structure used for demodulating and decoding is more complex and the cost is also higher.

SUMMARY

Embodiments of the present disclosure provide a method and an apparatus of transmitting a signal, to implement decoding the signal by a decoding algorithm, thereby making a digital circuit structure simpler and reducing the cost.

According to a first aspect, a method of transmitting a signal is provided, and the method includes:

receiving, by a wearable communication device, a modulated wave signal transmitted by a terminal device, where the modulated wave signal is a signal obtained after the terminal device encodes and modulates original data;

demodulating the received modulated wave signal to obtain a to-be-decoded signal;

performing a waveform shaping process on the to-be-decoded signal to obtain a square wave signal, wherein a high level in the square wave signal is configured to represent a first preset value, and a time interval is existed between two high levels in the square wave signal corresponding to any two adjacent first preset values;

acquiring a plurality of time interval eigenvalues in the square wave signal;

acquiring a first mapping relation, wherein the first mapping relation is configured to indicate a one-to-one mapping relation of the plurality of time interval eigenvalues and a plurality of coding sequences;

performing, according to the plurality of time interval eigenvalues and the first mapping relation, a first decoding process on the square wave signal to obtain an original coding sequence, wherein the original coding sequence is obtained by encoding the original data by the terminal device; and performing a second decoding process on the original coding sequence to obtain the original data.

Therefore, the corresponding coding sequence can be determined according to the one-to-one mapping relation of the plurality of time interval eigenvalues and the plurality of coding sequences, and the acquired plurality of time interval eigenvalues, thereby recovering the original data. The use of a complex digital circuit in the related art to decode may be avoided, such that the digital circuit structure is simplified, thereby reducing the cost.

With reference to the first aspect, in a first possible embodiment of the first aspect, acquiring the plurality of time interval eigenvalues in the square wave signal, includes:

setting a packet header signal to the modulated wave signal;

acquiring a period of the packet header signal, a pulse width of the modulated wave signal, and an edge deviation between a rising edge or a falling edge of each square wave in the square wave signal and a pulse starting point of the modulated wave signal when a threshold outputted from a comparator is greater than zero according to the packet header signal, where the comparator is configured to perform the waveform shaping process on the modulated wave signal; and acquiring the plurality of time interval eigenvalues according to the period of the packet header signal, the pulse width and the edge deviation.

With reference to the first aspect and the foregoing possible embodiments, in a second possible embodiment of the first aspect, the plurality of time interval eigenvalues include: a first eigenvalue, a second eigenvalue and a third eigenvalue, the plurality of coding sequences include a first Manchester sequence, a second Manchester sequence and a third Manchester sequence, where each coding sequence includes a second preset value and the first preset value, the square wave signal is used to represent the first preset value and the second preset value, the first mapping relation includes:

the first eigenvalue corresponding to the first Manchester sequence, wherein a value of a first bit of the first Manchester sequence is the first preset value and a value of a second bit of the first Manchester sequence is the second preset value;

the second eigenvalue corresponding to the second Manchester sequence, wherein a value of a first bit of the second Manchester sequence is the first preset value, a value of a second bit of the second Manchester sequence is the second preset value, and a value of a third bit of the second Manchester sequence is the second preset value;

the third eigenvalue corresponding to the third Manchester sequence, wherein a value of a first bit of the third Manchester sequence is the first preset value and a value of a second bit of the third Manchester sequence is the second preset value; and wherein the time interval eigenvalue is configured to characterize the time interval between any two adjacent high levels, the first bit is a bit corresponding to a first high level in the two adjacent high levels corresponding to the time interval eigenvalue, the second bit is the next bit after the first bit, and the third bit is the next bit after the second bit.

With reference to the first aspect and the foregoing possible embodiments, in a third possible embodiment of the first aspect, the original coding sequence is an original Manchester sequence obtained by performing a Manchester coding on the original data, and where performing, according to the plurality of time interval eigenvalues and the first mapping relation, the first decoding process on the square wave signal to obtain the original coding sequence, includes:

decoding, according to the plurality of time interval eigenvalues and the first mapping relation, the square wave signal to obtain a decoding result, where the decoding result includes the at least one first Manchester sequence, the at least one second Manchester sequence and the at least one third Manchester sequence; and performing, according to bits included in the decoding result, a recovering process on the decoding result to obtain the original Manchester sequence.

With reference to the first aspect and the foregoing possible embodiments, in a fourth possible embodiment of the first aspect, the decoding result is a Manchester sequence including S bits, S is a natural number greater than or equal to 2, and where performing, according to the bits included in the decoding result, the recovering process on the decoding result to obtain the original Manchester sequence, includes:

if mod (S, 2)=0, determining values of the last two bits of the original data according to a waveform in the square wave signal corresponding to the last two bits of the original Manchester sequence; or if mod (S, 2)=1, determining values of the last two bits of the original data according to a waveform in the square wave signal corresponding to the second last bit of the original Manchester sequence; and determining the original Manchester sequence according to the decoding result and the values of the last two bits of the original Manchester sequence.

With reference to the first aspect and the foregoing possible embodiments, in a fifth possible embodiment of the first aspect, receiving, by the wearable communication device, the modulated wave signal transmitted by the terminal device, includes:

receiving, by the wearable communication device, the modulated wave signal transmitted by the terminal device through a first channel line;

where demodulating the received modulated wave signal to obtain the to-be-decoded signal, includes:

receiving a carrier signal transmitted by the terminal device through a second channel line, where the carrier signal is configured to modulate the original coding sequence to obtain the modulated wave signal; and demodulating, based on the carrier signal, the modulated wave signal to obtain the to-be-decoded signal.

With reference to the first aspect and the foregoing possible embodiments, in a sixth possible embodiment of the first aspect, the carrier signal is obtained by performing an amplitude modulation on a sine wave of a first frequency and a sine wave of a second frequency, and a frequency difference between the first frequency and the second frequency is greater than or equal to 20 kHz.

Therefore, the carrier signal together with the modulated wave signal is transmitted to a receiving end device (for example, the wearable communication device), such that the receiving end device may demodulate the modulated wave signal directly according to a received carrier signal, and a complex carrier recovering module is omitted, thereby further simplifying a digital circuit and reducing the cost.

According to a second aspect, a method of transmitting a signal is provided, and the method includes:

encoding, by a terminal device, original data to obtain an original coding sequence;

modulating the original coding sequence to obtain a modulated wave signal; and transmitting the modulated wave signal to a wearable communication device.

With reference to the second aspect, in a first possible embodiment of the second aspect, modulating the original coding sequence to obtain the modulated wave signal, includes:

performing an amplitude modulation on a sine wave of a first frequency and a sine wave of a second frequency to obtain a carrier signal, where a frequency difference between the first frequency and the second frequency is greater than or equal to 20 kHz; and performing, based on the carrier signal, an ASK modulation on the original coding sequence to obtain the modulated wave signal.

Therefore, noise generated in a downlink communication procedure can be avoided by modulating sine waves of two different frequencies (specifically, the frequency difference is greater than or equal to 20 kHz) to obtain the carrier signal.

With reference to the second aspect and the foregoing possible embodiments, in a second possible embodiment of the second aspect, transmitting the modulated wave signal to the wearable communication device, includes:

transmitting the modulated wave signal to the wearable communication device through a first channel line;

the method further includes:

transmitting the carrier signal to the wearable communication device through a second channel line, where the carrier signal is configured to demodulate the received modulated wave signal by the wearable communication device to obtain a to-be-decoded signal.

Therefore, the carrier signal together with the modulated wave signal is transmitted to a receiving end device (for example, the wearable communication device), such that the receiving end device may demodulate the modulated wave signal directly according to a received carrier signal, and a complex carrier recovering module is omitted, thereby further simplifying a digital circuit and reducing the cost.

According to a third aspect, a wearable communication device that can execute an operation executed by the wearable communication device in the foregoing first aspect or any of the possible embodiments of the first aspect is provided. Specifically, the wearable communication device may include a module unit that is configured to execute an operation executed by the wearable communication device in the foregoing first aspect or any of the possible embodiments of the first aspect.

According to a fourth aspect, a terminal device that can execute an operation executed by the terminal device in the foregoing second aspect or any of the possible embodiments of the second aspect is provided. Specifically, the terminal device may include a module unit that is configured to execute an operation executed by the terminal device in the foregoing second aspect or any of the possible embodiments of the second aspect.

According to a fifth aspect, a wearable communication device is provided, and the wearable communication device includes a receiver, a transmitter, a processor, a memory, and a bus system, where the receiver, the transmitter, the memory, and the processor are connected via the bus system, the memory is configured to store instructions, the processor is configured to execute instructions stored in the memory to control the receiver to receive a signal, the transmitter transmits the signal, and when the processor executes the instructions stored by the memory, the execution causes the processor to execute the method in the first aspect or any of the possible embodiments of the first aspect.

According to a sixth aspect, a terminal device is provided, and the terminal device includes a receiver, a transmitter, a processor, a memory, and a bus system, where the receiver, the transmitter, the memory, and the processor are connected via the bus system, the memory is configured to store instructions, the processor is configured to execute instructions stored in the memory to control the receiver to receive a signal, the transmitter transmits the signal, and when the processor executes the instructions stored by the memory, the execution causes the processor to execute the method in the second aspect or any of the possible embodiments of the second aspect.

According to a seventh aspect, a computer storage medium is provided, the computer storage medium stores program code, and the program code is configured to instruct executing an operation executed by an interface generation apparatus in the foregoing first aspect or any of the possible embodiments of the first aspect.

According to an eighth aspect, a computer storage medium is provided, the computer storage medium stores program code, and the program code is configured to instruct executing an operation executed by an interface generation apparatus in the foregoing second aspect or any of the possible embodiments of the second aspect.

In some of the foregoing embodiments, the wearable communication device is a wired earphone.

Therefore, the embodiments of the present disclosure provide a method and an apparatus of transmitting a signal, to implement decoding the signal by the decoding algorithm, thereby making the digital circuit structure simpler and reducing the cost.

BRIEF DESCRIPTION OF DRAWINGS

To describe the technical solutions in embodiments of the present disclosure more clearly, the following briefly introduces the accompanying drawings required for describing the embodiments. Apparently, the accompanying drawings in the following description show some embodiments of the present disclosure, and persons of ordinary skill in the art may still derive other drawings from these accompanying drawings without creative efforts.

DESCRIPTION OF EMBODIMENTS

A clear and complete description of technical solutions of embodiments of the present disclosure will be given below, in combination with the accompanying drawings in the embodiments of the present disclosure. Apparently, the embodiments described below are a part, but not all, of the embodiments of the present disclosure. All of other embodiments, obtained by persons of ordinary skill in the art based on the embodiments of the present disclosure without any creative efforts, fall into the protection scope of the present disclosure.

It should be understood that a wearable communication device according to embodiments of the present disclosure may be a wearable device such as a smart bracelet, an earphone, or the like that can communicate with a terminal device by means of a wired communication or a wireless communication. The wearable device can be used to implement functions such as a heart rate detection, a step recording and the like.

Hereinafter, without loss of generality, the terminal device transmitting the signal to the earphone is taken as an example, and a specific process of the method of transmitting the signal according to an embodiment of the present disclosure will be described below in detail.

It should be understood that the earphone according to an embodiment of the present disclosure includes an earpiece (also referred to as an earbud or an earmuff), and the earpiece includes a loudspeaker. The earphone is connected to the terminal device via an earphone cable, for example, the earphone cable includes a four-segment pin (or a four-segment earphone connector) that can be inserted into a four-segment audio interface of the terminal device.

The terminal device according to an embodiment of the present disclosure may be a variety of audio source devices, and the terminal device includes the four-segment audio interface that may supply power to the earphone and drive the loudspeaker (also referred to as a speaker) and a microphone of the earphone after the four-segment audio interface is connected to the four-segment pin of the earphone, for example, the four-segment audio interface may be an active 3.5 mm socket. Specifically, the terminal device may be a portable or desktop electronic device, and may be, for example, a variety of hand-held terminals such as a mobile phone, a tablet computer, a music player, or a recorder, and is not limited to a communication terminal.

It also should be understood that the method of transmitting the signal between the terminal device and the earphone shown in the present disclosure is merely illustrative and shall not limit the present disclosure in any way. The embodiments of the present disclosure are also applicable to other wearable communication device other than the earphone.

Figure 1:
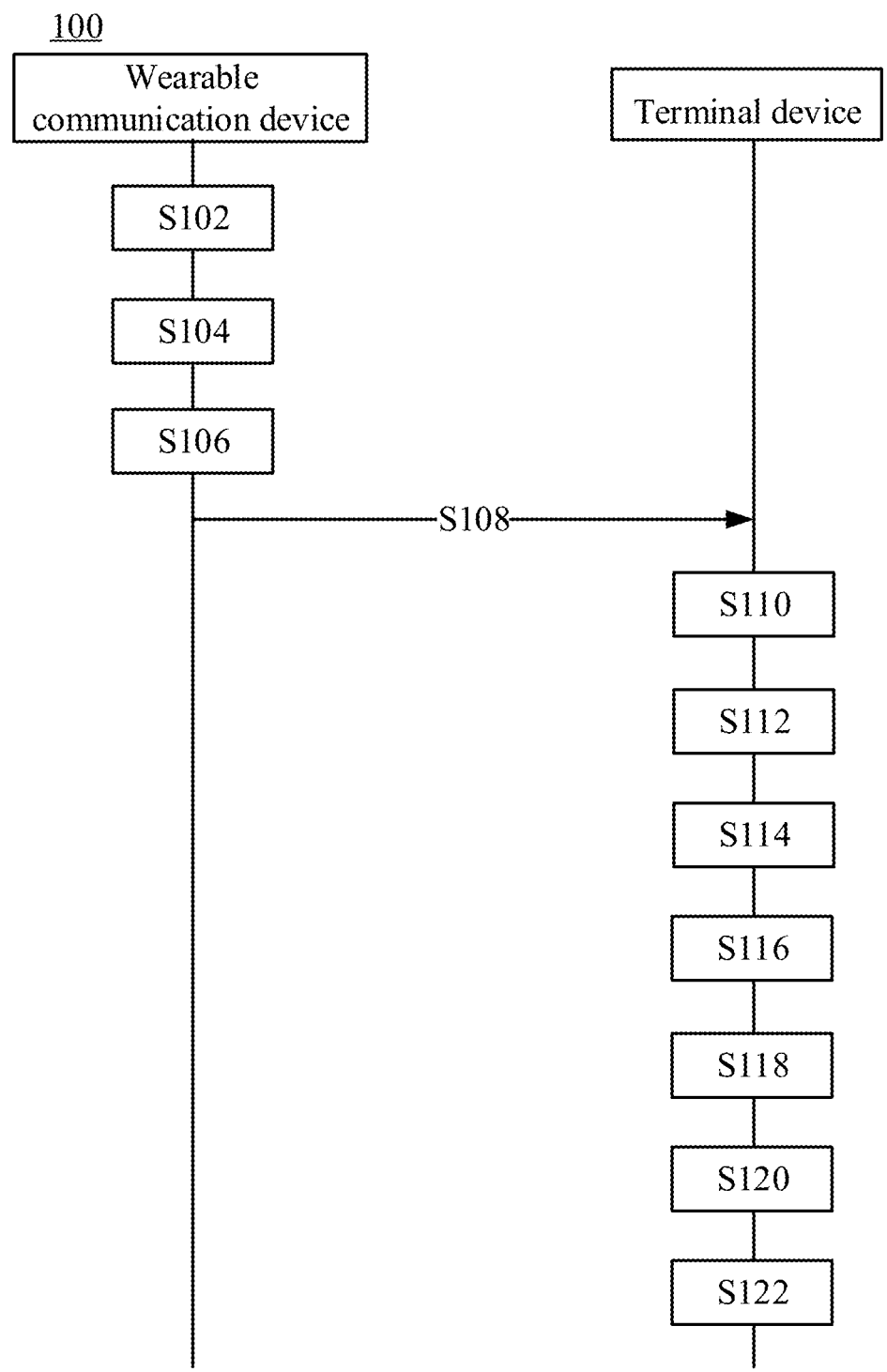
FIG. 1 is a schematic flowchart of a method of transmitting a signal according to an embodiment of the present disclosure shown from the perspective of device interaction.

FIG. 1 is a schematic flowchart of a method 100 of transmitting a signal according to an embodiment of the present disclosure shown from the perspective of device interaction. It should be understood that FIG. 1 shows detailed communication steps or operations of a method of transmitting a signal, but the steps or operations are merely illustrative and the embodiments of the present disclosure may also execute other operations or variations of a variety of operations in FIG. 1. In addition, each step in FIG. 1 may be executed in a different order than that shown in FIG. 1, and not all of the operations in FIG. 1 may be executed.

Detailed steps of the method 100 will be described in detail as follows.

As shown in FIG. 1, the method 100 includes the following steps:

S102. Encoding original data by a terminal device to obtain an original coding sequence.

Specifically, the original data may be a sequence including binary numbers "1" and "0". A coding sequence may be obtained by encoding the original data. By way of example but not limitation, the encoding may be a Manchester coding, and the coding sequence may be a Manchester sequence. For the sake of distinction and explanation, a sequence obtained by encoding the original data is referred to as the original Manchester sequence. Hereinafter, for the sake of understanding and explanation, the Manchester sequence obtained after the Manchester coding is taken as an example, and a specific process of the method of transmitting the signal of an embodiment of the present disclosure will be described.

Figure 2:
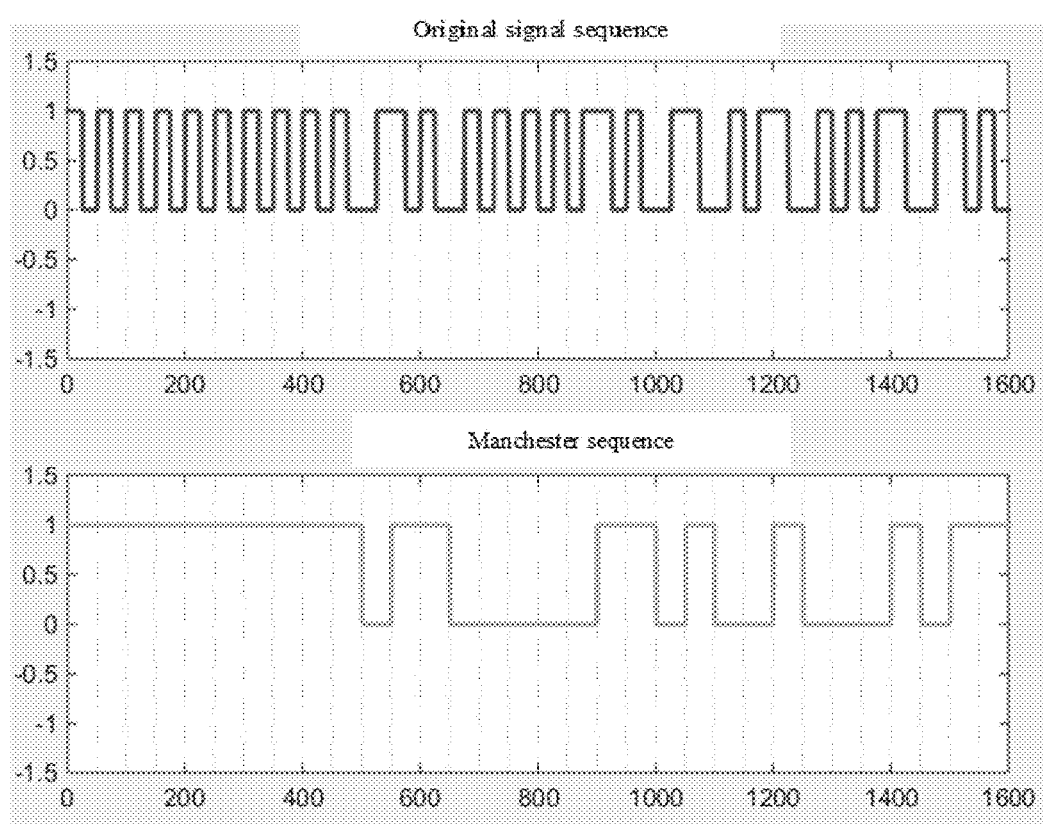
FIG. 2 is a schematic diagram of original data and an original Manchester sequence obtained by performing a Manchester coding on the original data.

Specifically, in the Manchester coding, a binary number "1" may be denoted as "10" and "0" may be denoted as "01". FIG. 2 illustrates a schematic diagram of original data and an original Manchester sequence obtained by performing a Manchester coding on the original data. FIG. 2a is a schematic diagram denoting original data "10101" by a square wave. FIG. 2b is a schematic diagram of a square wave of a Manchester sequence "1001100110" obtained by performing the Manchester coding on the original data.

S104. Generating a carrier signal by the terminal.

Specifically, the carrier signal is configured to perform a modulation process on the original Manchester sequence. By way of example but not limitation, a modulation method may be an amplitude shift keying (ASK) modulation process. It should be understood that an ASK modulation served as a method of modulation is merely illustrative and shall not limit the present disclosure in any way, and the present disclosure shall not be limited thereto. For example, the modulation method may include a phase shift keying (PSK) modulation, a frequency shift keying (FSK), and the like. Hereinafter, for the sake of understanding and explanation, the ASK modulation is taken as an example, and a specific process of the method of transmitting the signal of an embodiment of the present disclosure will be described.

It is to be noted that the carrier signal referred to herein may be understood as a signal for carrying transmission data or transmission information, and the carrier signal itself does not carry the signal. Specifically, the carrier signal is configured to perform the modulation process on the original Manchester sequence to obtain a modulated wave signal.

Illustratively, the carrier signal may be a sine wave of a single frequency point.

Optionally, the carrier signal may be obtained by modulating two sine waves with different frequency points. Specifically, the carrier signal, which can be denoted as a target carrier signal, may be obtained by modulating a sine wave of a first frequency which can be denoted as a first carrier and a sine wave of a second frequency which can be denoted as a second carrier. In order to ensure that a communication frequency falls within the 20 kHz band, a frequency difference between the first frequency and the second frequency is greater than or equal to 20 kHz. For example, the first frequency is 21 kHz, the second frequency is 1 kHz; or, the first frequency is 30 kHz, the second frequency is 10 kHz.

Specifically, assuming that the first carrier is $y_{c1}$, the second carrier is $y_{c2}$, and the target carrier formed by an amplitude modulation is $y_c$:

$$y_{c1}=\sin(2\pi*f_{c1}*t);$$

$$y_{c2}=\sin(2\pi*f_{c2}*t);$$

$$y_c=y_{c1}*y_{c2}.$$

$f_{c1}$ is a frequency of $y_{c1}$ (that is, the first frequency), $f_{c2}$ is a frequency of $y_{c2}$ (that is, the second frequency), and $|f_{c1}-f_{c2}|\geq 20$ kHz. An envelope frequency of $y_c$ is $2f_{c2}$, and a communication rate is $f_{c2}$.

Figure 3:
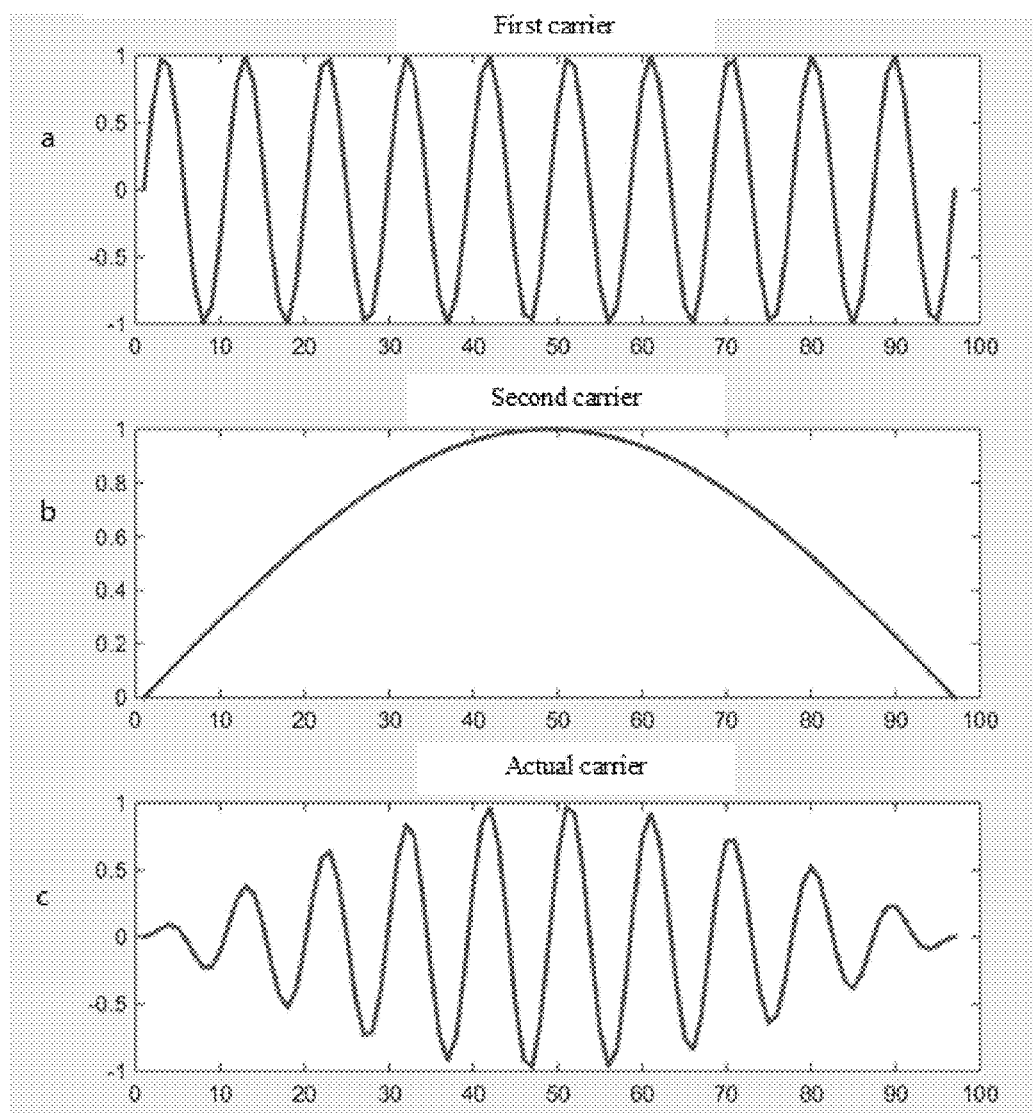
FIG. 3 is a schematic diagram of modulating a first carrier and a second carrier to obtain a target carrier.

FIG. 3 is a schematic diagram of modulating a first carrier and a second carrier to obtain a target carrier. FIG. 3a is a schematic diagram of a sine wave of a first frequency (for example, $f_{c1}=21$ kHz), FIG. 3b is a schematic diagram of a sine wave of a second frequency (for example, $f_{c2}=1$ kHz), and FIG. 3c is a schematic diagram of the target carrier obtained by modulating the sine wave of the first frequency and the second frequency of the sine wave.

It should be understood that values of the first frequency and the second frequency illustrated herein are merely illustrative and shall not limit the present disclosure in any way, and the values fall within the scope of the present disclosure as long as the frequency difference between the first frequency and the second frequency is greater than or equal to 20 kHz.

It also should be understood that the first carrier and the second carrier used to modulate the carrier signal illustrated herein are merely illustrative, and shall not limit the present disclosure in any way, and the present disclosure does not particularly limit types and the number of signals that are used to modulate a amplitude modulation wave.

S106. Performing, by the terminal, an ASK modulation on an original Manchester sequence based on the carrier signal, to obtain a modulated wave signal.

Specifically, the terminal device performs the ASK modulation on the original Manchester sequence obtained at S102 based on the carrier signal obtained at S104. It should be understood that an ASK modulation method may be identical to that of the prior art. For brevity, a detailed description of performing the ASK modulation on the original Manchester sequence is omitted herein.

Figure 4:
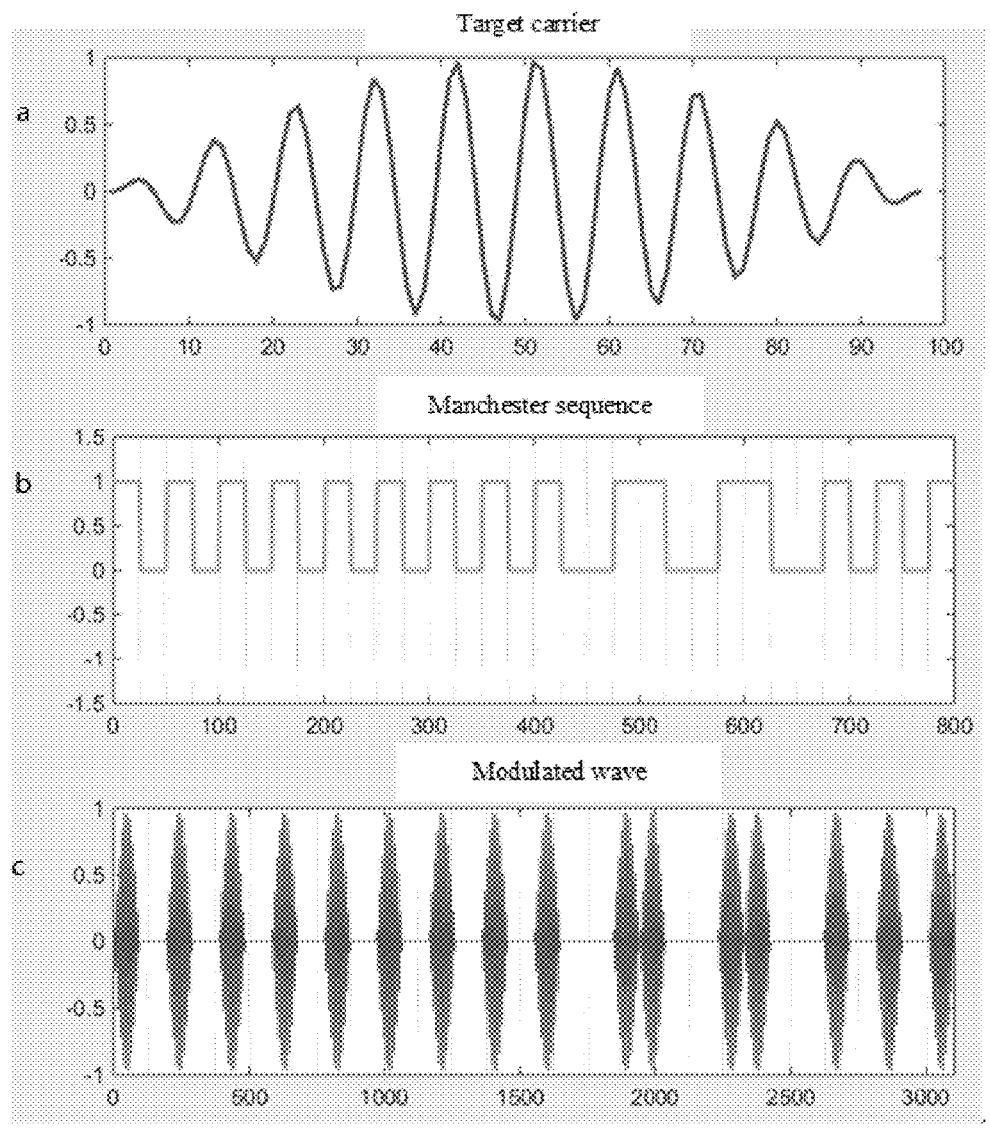
FIG. 4 is a schematic diagram of performing an ASK modulation on an original Manchester sequence by a target carrier to obtain a modulated wave.

FIG. 4 illustrates a schematic diagram of performing an ASK modulation on an original Manchester sequence by a target carrier to obtain a modulation wave. FIG. 4a is a schematic diagram of the target carrier; FIG. 4b is a schematic diagram of the original Manchester sequence. FIG. 4c is a schematic diagram of the modulation wave obtained by performing the ASK modulation on the original Manchester sequence by the target carrier. It can be seen that a signal wave after the ASK modulation presents a discontinuous waveform similar to the sine wave.

S108. Transmitting, by the terminal, the modulated wave signal to an earphone.

Specifically, the terminal device may perform a digital-to-analog conversion on the modulated wave signal via an audio codec unit (Audio Codec Unit) and transmit a processed modulated wave signal to the earphone after an amplification process of an audio amplifier unit (Audio Amplifier Unit). Specifically, the modulated wave signal may be transmitted through an earphone cable connected between the terminal device and the earphone.

It should be understood that one end of the earphone cable may include a four-segment pin including a left channel L pin, a right channel R pin, a ground G pin and a microphone M pin. The earphone is connected to the terminal device through the four-segment pin of the earphone cable. Specifically, the four-segment pin is configured to be connected to the four-segment audio interface of the terminal device, and the terminal device drives the left and right speakers and the microphone of the earphone through the left channel L pin, the right channel R pin and the microphone M pin. The earphone cable connected to the left channel L pin is a left channel L line, the earphone cable connected to the right channel R pin is a right channel R line, and the earphone cable connected to the microphone M pin is a microphone M line, and the earphone cable connected to the grounded G pin is ground.

In an embodiment of the present disclosure, the earphone may receive the modulated wave signal from the terminal device through the left channel L line or the right channel R line (that is, an example of a first channel line).

Optionally, S108. Transmitting, by the terminal, the modulated wave signal to an earphone, includes:

the terminal device transmitting the modulated wave signal to the earphone through a first channel line;

the method 100 may further include:

transmitting, by the terminal device, the carrier signal to the earphone through a second channel line, where the carrier signal is configured to demodulate the received modulated wave signal by the earphone to obtain a to-be-decoded signal.

Specifically, the terminal may transmit the modulated wave signal through any one of a left channel L line and a right channel R line (that is, an example of a first channel line) and transmit a carrier (for example, the target carrier) signal through another channel line (that is, an example of a second channel line). Specifically, the first channel line may be the left channel L line, the second channel line may be the right channel R line; or the first channel line may be the right channel R line, the second channel line may be the left channel L line. The present disclosure is not particularly limited thereto.

It should be noted that in the current technique, a receiving end (for example, the earphone) can demodulate a received modulated wave signal through a digital circuit, and this requires a complex carrier recovering module to acquire a carrier. Further, as an alternative embodiment, a target carrier signal may be obtained by modulating two carriers, that is, the target carrier is different from a single frequency point carrier, and the corresponding carrier recovering module is more complex and therefore a more complex digital circuit is required to implement a demodulation of the modulated wave signal.

In the embodiment of the present disclosure, the terminal (that is, an example of a transmitting end) transmits the carrier signal directly to the earphone (that is, an example of the receiving end) through the second channel line, so that the earphone may perform a demodulating process directly according to the received carrier signal, and the complex carrier recovering module can be omitted, thereby reducing the complexity of the digital circuit.

A specific process of demodulating and decoding (or transcoding) the modulated wave signal will be described in detail below.

S110. Demodulating, by the earphone, the received modulated wave signal to obtain a to-be-decoded signal.

Specifically, the earphone can capture the signal (including the modulated wave signal and the carrier signal) directly through an analog-to-digital converter (ADC) after the modulated wave signal transmitted by the terminal device through the first channel line and the carrier signal transmitted by the terminal device through the second channel line are respectively received. For example, if the left channel line transmits a modulated wave signal $y_m$, and the right channel line transmits a carrier signal $y_c$, a process of demodulating the modulated wave signal may be as follows:

$$y_{dm1}=y_m*y_c,$$

where $y_{dm1}$ is a demodulated signal, that is, a to-be-decoded signal.

Optionally, a high frequency signal may be filtered by a low pass filter (LPF) to obtain the to-be-decoded signal.

Figure 5:
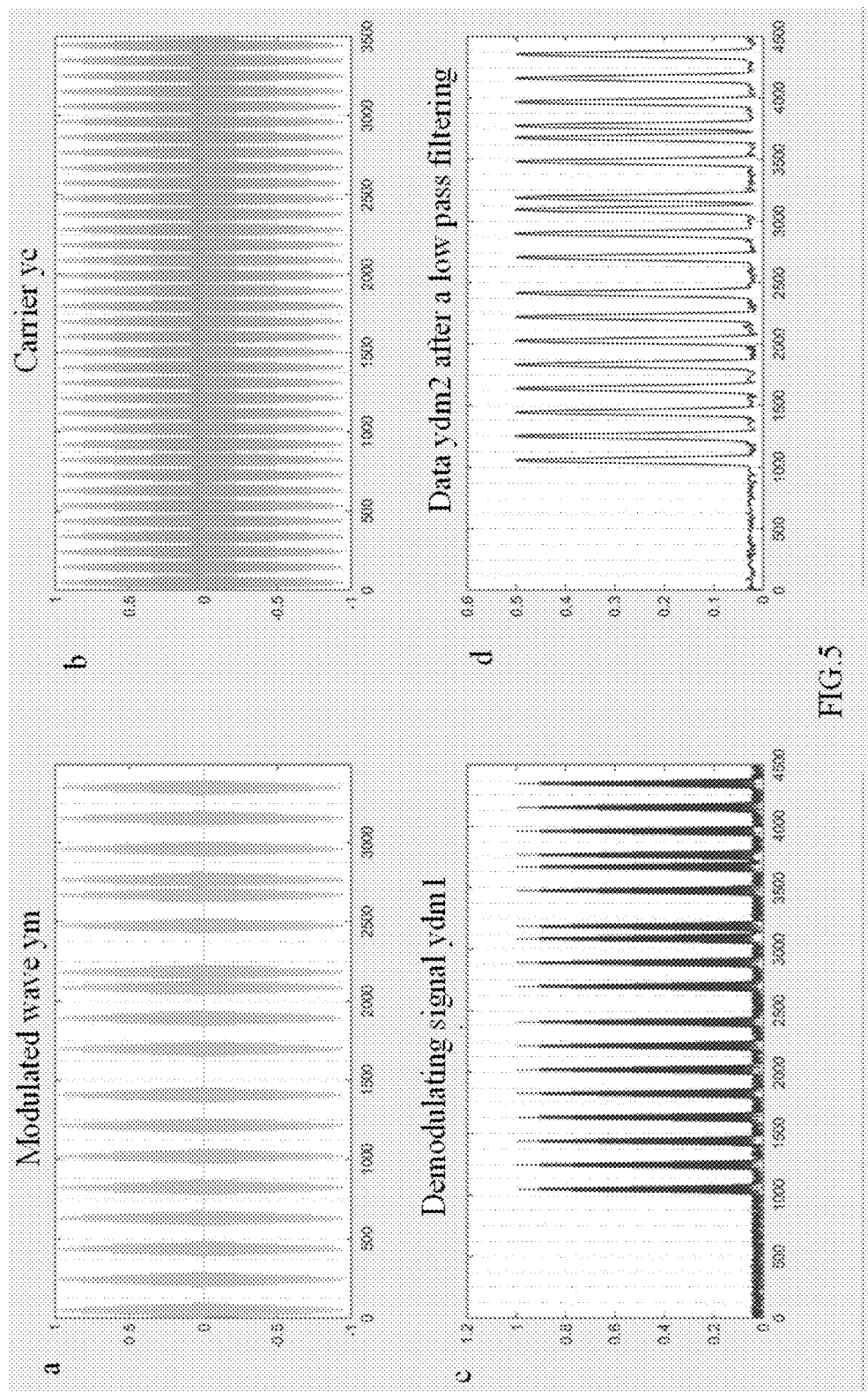
FIG. 5 is a schematic diagram of demodulating a modulated wave signal.

FIG. 5 shows a schematic diagram of demodulating a modulated wave signal. FIG. 5a is a schematic diagram of a modulated wave signal $y_m$; FIG. 5b is a schematic diagram of a carrier signal $y_c$; FIG. 5c is a schematic diagram of a demodulated signal $y_{dm1}$; and FIG. 5d is a schematic diagram of a signal $y_{dm2}$ after a low pass filtering. It can be seen that the signal $y_{dm2}$ after a low pass filtering is a signal in which the signal outside the band and interference of the needless frequency band and frequency are filtered.

S112. Performing, by the earphone, a waveform shaping process on the to-be-decoded signal to obtain a square wave signal.

Specifically, the earphone may perform the waveform shaping process on the to-be-decoded signal through a waveform shaping algorithm. For example, a threshold may be outputted from a comparator, and according to the threshold outputted from the comparator, a shaping process is performed on the waveform to obtain the square wave signal.

In an embodiment of the present disclosure, after the square wave signal is obtained, the earphone may perform the decoding process on the square wave signal to obtain original data according to a mapping relation between a plurality of time interval eigenvalues and a plurality of coding sequences (for example, a Manchester sequence).

Optionally, according to the mapping relation of the plurality of time interval eigenvalues and the plurality of coding sequences, performing the decoding process on the square wave signal to obtain the original data, includes:

decoding, according to the plurality of time interval eigenvalues and the first mapping relation, the square wave signal to obtain a decoding result, where the decoding result includes the at least one first Manchester sequence, the at least one second Manchester sequence and the at least one third Manchester sequence;

according to a bit included in the decoding result, performing a recovering process on the decoding result to obtain the original Manchester sequence, the original Manchester sequence being a sequence obtained by encoding the original data;

performing a second decoding process on the original Manchester sequence to obtain the original data.

A process of the decoding process is described in detail below.

S114. Acquiring, by the earphone, a plurality of time interval eigenvalues in the square wave signal.

Specifically, the square wave signal can be understood as a waveform including a plurality of high levels and a plurality of low levels. In the square wave signal, the first preset value may denote the high level. A time interval can be understood as an interval of the high levels corresponding to any two adjacent first preset values, or the time interval can be understood as a duration of a low level. In other words, high levels corresponding to any two adjacent first preset values have the time interval.

Optionally, the acquiring of a plurality of time interval eigenvalues in the square wave signal in S114 may include:

setting a packet header signal to the modulated wave signal;

acquiring a period of the packet header signal, a pulse width of the modulated wave signal, and an edge deviation between a rising edge or a falling edge of each square wave in the square wave signal and a pulse starting point of the modulated wave signal when a threshold outputted from a comparator is greater than zero according to the packet header signal, where the comparator is configured to perform the waveform shaping process on the modulated wave signal; and acquiring the plurality of time interval eigenvalues according to the period of the packet header signal, the pulse width and the edge deviation.

Specifically, when the earphone receives the modulated wave signal transmitted by the terminal device, the earphone does not know in advance the original data corresponding to the modulated wave signal, and therefore, it cannot be determined that the time interval eigenvalues in the waveform of the modulated wave signal correspond to which time interval eigenvalues. The embodiment of the present disclosure may acquire three eigenvalues (that is, $t_1$, $t_2$, and $t_3$) included in the time interval eigenvalues by means of setting the packet header signal for the modulated wave signal.

Figure 6:
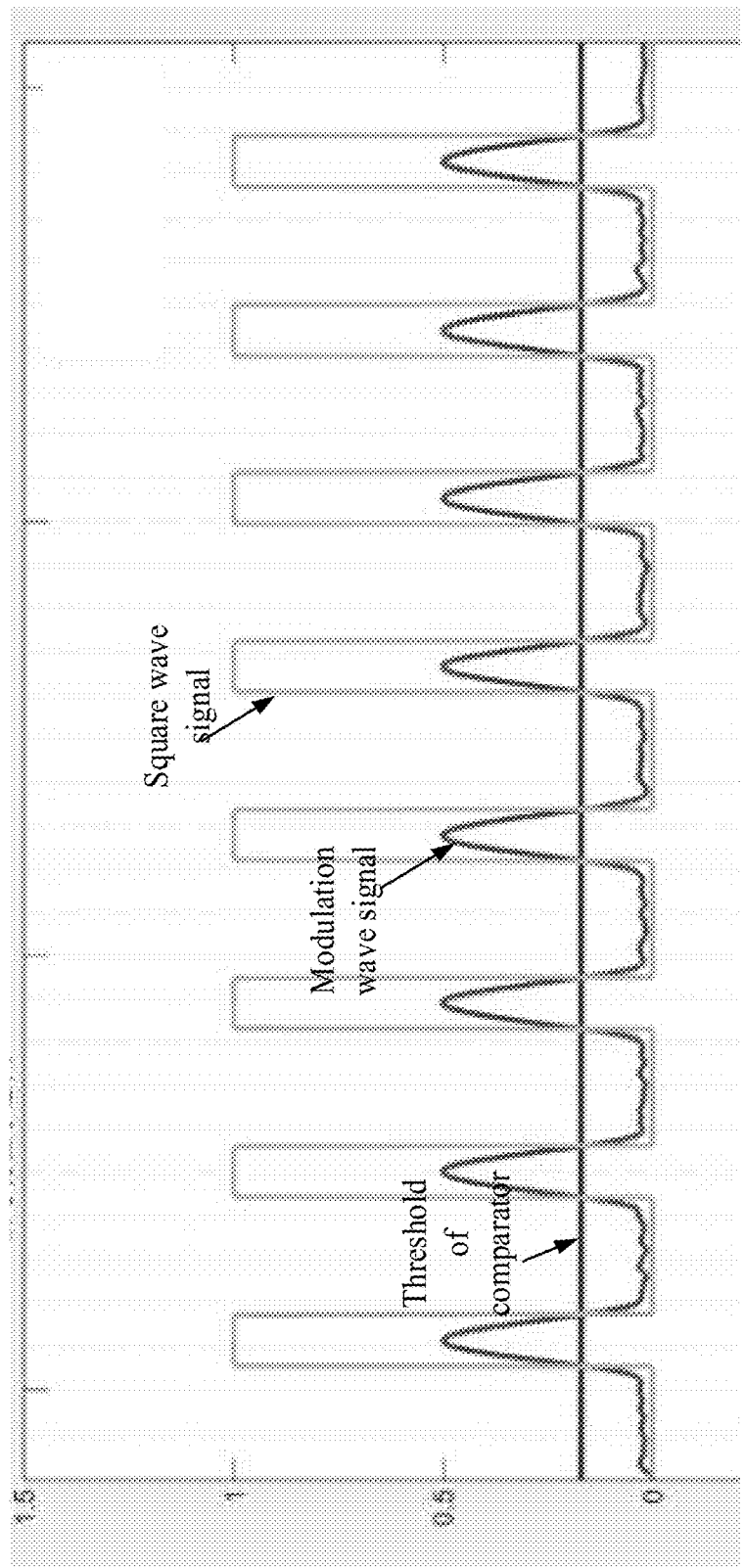
FIG. 6 is a modulated waveform diagram of a packet header signal that is a hexadecimal number 0xff and square wave diagram.

For example, assuming that the packet header signal is a hexadecimal number 0xff, a modulated waveform diagram being encoded and modulated by the terminal device can be shown in FIG. 6, and a square wave diagram obtained after performing the waveform shaping process on the modulated wave of the packet header signal can also be shown in FIG. 6.

FIG. 6 shows a modulated waveform diagram of a packet header signal that is a hexadecimal number 0xff and a square wave diagram. It should be understood that the hexadecimal number 0xff may correspond to binary numbers 1111 1111 and the corresponding Manchester sequence is 1010 1010 1010 1010. In this way, a period $T_s$ of the packet header signal, a pulse width $T_w$ of the modulated wave signal, and an edge deviation $T_u$ between the square wave and a pulse starting point of the modulated wave signal when a threshold outputted from a comparator is greater than zero can be obtained, according to the process of performing the waveform shaping process on the modulated wave according to the threshold outputted from the comparator as shown in FIG. 6. Time of a rising edge and the falling edge of the packet header data is obtained and is respective saved as an array rise [N] and an array fall [N], where N is the number of pulses in the header packet signal. There are:

$$T_s = \frac{1}{N-1} \sum_{i=2}^{N} (\text{rise}(i) - \text{rise}(i-1));$$

$$T_w = \frac{1}{N} \sum_{i=1}^{N} (\text{fall}(i) - \text{rise}(i));$$

$$T_u = \frac{T_s - 2*T_w}{4}.$$

As can be seen from the foregoing description, the time interval eigenvalues can be calculated by t (i)=rise (i)–fall (i–1). In this way, the foregoing three eigenvalues can be obtained. Details are as follows:

$t_1 = T_s - T_w$ $t_2 = T_s + 2*T_u$ $t_3 = 2*T_u$

Hence, three eigenvalues can be obtained by calculation.

It should be understood that the specific method for obtaining the three eigenvalues included in the time interval eigenvalues, the calculation formulas of $T_s$, $T_w$ and $T_u$ and the calculation formulas of $t_1$, $t_2$ and $t_3$ illustrated above are merely illustrative and shall not limit the present disclosure in any way. When the packet header signals are different, the calculation formulas of $T_s$, $T_w$ and $T_u$ are different, and the calculation formulas of $t_1$, $t_2$ and $t_3$ are different, whereas values of $t_1$, $t_2$ and $t_3$ are unchanged. The method of obtaining the values of $t_1$, $t_2$ and $t_3$ through another packet header data falls within the protection scope of the present disclosure.

As can be seen from the foregoing description, the square wave signal is obtained by performing the shaping process on the waveform according to the threshold outputted from the comparator, and therefore, the length of each high level may be less than or equal to $\frac{1}{2}T_s$. In other words, two high levels corresponding to any two continuous first preset values have the time interval, the time interval is $2T_u$, that is, $t_3$.

S116. Acquiring, by the earphone, a first mapping relation.

Specifically, the first mapping relation is used to indicate a one-to-one mapping relation of the plurality of time interval eigenvalues and a plurality of coding sequences (for example, a Manchester sequence).

Optionally, the plurality of time interval eigenvalues includes: a first eigenvalue, a second eigenvalue and a third eigenvalue, the plurality of coding sequences include a first Manchester sequence, a second Manchester sequence and a third Manchester sequence, where each coding sequence includes a second preset value and the first preset value, the square wave signal is used to represent the first preset value and the second preset value, the first mapping relation includes:

the first eigenvalue corresponding to the first Manchester sequence, where the first Manchester sequence is: a value of a first bit being the first preset value and a value of a second bit being the second preset value;

the second eigenvalue corresponding to the second Manchester sequence, where the second Manchester sequence is: a value of the first bit being the first preset value, a value of the second bit being the second preset value, and a value of a third bit being the second preset value;

the third eigenvalue corresponding to the third Manchester sequence, where the third Manchester sequence is: a value of the first bit being the first preset value and a value of the second bit being the second preset value; and where the time interval eigenvalue is used to characterize a time interval between any two adjacent high levels, the first bit is a bit corresponding to the first high level in two adjacent high levels corresponding to the time interval eigenvalue, the second bit is the next bit after the first bit, and the third bit is the next bit after the second bit.

In the embodiment of the present disclosure, the modulated wave signal transmitted by the terminal device is obtained via the Manchester coding, that is, the first preset value may be "1" and the second preset value may be "0".

The square wave corresponding to the sequence obtained by the Manchester coding has the following three types:

1) when the Manchester sequence is "1010" or "0101" (or the Manchester sequence is "101"), that is, respectively corresponding to the original data "11" or "00", the corresponding square waves have a first eigenvalue $t_1$ of the time interval eigenvalues. That is, the first eigenvalue corresponds to the first Manchester sequence, and the first Manchester sequence is "10".

2) when the Manchester sequence is "1010", that is, respectively corresponding to the original sequence "10", the corresponding square waves have a second eigenvalue $t_2$ of the time interval eigenvalues. That is, the second eigenvalue corresponds to the second Manchester sequence, and the second Manchester sequence is "100".

3) when the Manchester sequence is "0110" (or the Manchester sequence is "11"), that is, respectively corresponding to the original sequence "01", the corresponding square waves have a third eigenvalue $t_3$ of the time interval eigenvalues. That is, the third eigenvalue corresponds to the third Manchester sequence, and the third Manchester sequence is "10".

Figure 7:
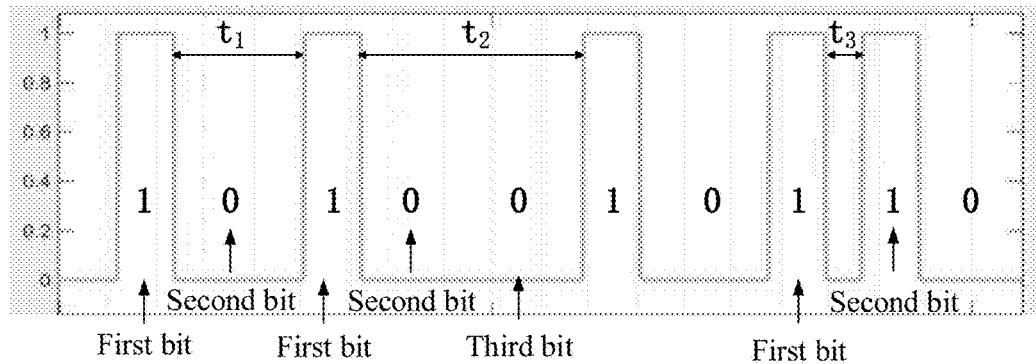
FIG. 7 is a schematic diagram of a one-to-one mapping relation of a plurality of time interval eigenvalues and a plurality of Manchester sequences.

FIG. 7 shows a schematic diagram of a one-to-one mapping relation of a plurality of time interval eigenvalues and a plurality of Manchester sequences. As can be seen from the figure, the time interval may be expressed as a time difference between the time when in the second square wave of the two adjacent square waves appears the rising edge and the time when in the first square wave of the two adjacent square waves appears the falling edge, or it can be understood as a time length of the low level. The first bit may correspond to a bit corresponding to the first square wave (specifically, the high level) in the two adjacent square waves (specifically, the high levels).

S118. Decoding, by the earphone, the square wave signal to obtain a decoding result according to the first mapping relation.

It can be seen from S116 that the three eigenvalues of the time interval eigenvalues correspond to the three values of the Manchester sequence. Therefore, the earphone can decode according to the to-be-decoded signal demodulated to obtain the decoding result.

Referring again to FIG. 7, when the time interval eigenvalue is the first eigenvalue $t_1$, a value of a bit (that is, the first bit) corresponding to the first square wave in the two adjacent square waves corresponding to the time interval eigenvalue is "1", and a value of a bit (that is, the second bit) after the first bit is "0"; when the time interval eigenvalue is the second eigenvalue $t_2$, a value of the first bit is "1", a value of the second bit is "0", and a value of a bit (that is, the third bit) after the second bit is "0"; when the time interval eigenvalue is the third eigenvalue $t_3$, the value of the first bit is "1", in this situation, and the value of the second bit can be "1" and the value of the second bit, can be taken according to the eigenvalue of the next time interval, it can be understood that with regard to the next time interval, the second bit is the first bit of the next time interval.

It should be noted that the waveform after the last pulse of the waveforms shown in FIG. 7 may not be known and it may be the high level or the low level. That is, after the last high level of the square wave signal, the time interval eigenvalue cannot be determined. Therefore, a value of the corresponding Manchester code cannot be determined according to the bit corresponding to the last high level and the subsequent bits.

S120. Performing a recovering process on the decoding result to obtain the original coding sequence.

Since the Manchester sequence is obtained by performing the Manchester coding on the binary sequence, that is, a binary number "1" corresponds to the Manchester sequence "10" and a binary number "0" corresponds to the Manchester sequence "01", bits included in a complete Manchester sequence is an integer multiple of 2.

Therefore, the value of the last bit can be determined according to the number of bits of the decoding result obtained by the decoding process at S118.

Optionally, the decoding result is a Manchester sequence including S bits, S is a natural number greater than or equal to 2, and where performing, according to the bit included in the decoding result, the recovering process on the decoding result to obtain the original Manchester sequence, includes:

if mod (S, 2)=0, determining values of the last two bits of the original data according to a waveform in the square wave signal corresponding to the last two bits of the original Manchester sequence; or if mod (S, 2)=1, determining values of the last two bits of the original data according to a waveform in the square wave signal corresponding to the second last bit of the original Manchester sequence; and determining the original Manchester sequence according to the decoding result and the values of the last two bits of the original Manchester sequence.

Specifically, assuming that the decoding result is a Manchester sequence including S bits, if a value of mod (S, 2) is 0, it means that there are just 2 bits difference between the decoding result and the original Manchester sequence, that is, it can correspond to the two bits corresponding to the last pulse shown in FIG. 7. In FIG. 7, values of the last two bits are "10" and accordingly, a complete Manchester sequence (that is, the original Manchester sequence) can be obtained. If a value of mod (S, 2) is 1, it means that there is just 1 bit difference between the decoding result and the original Manchester sequence. In this case, the value of the bit that is not included in the square wave signal is added according to the last bit corresponding to the square wave signal. If the last bit of the decoding result is "0", one bit is added, and a value of the bit is "1" to construct "01". If the last bit of the decoding result is "1", one bit is added, and a value of the bit is "0" to construct "10".

In the embodiment of the present disclosure, the decoding in S118 and the recovering process in S120 may be collectively referred to as a first decoding process for processing the to-be-decoded signal to obtain the original coding sequence.

S122. Performing, by the earphone, a second decoding process on the original coding sequence to obtain the original data.

Specifically, the earphone decodes "10" in the original Manchester sequence to "1" and decodes "01" in the original Manchester sequence to "0" according to the principle of the Manchester coding, to recover the original data.

Figure 8:
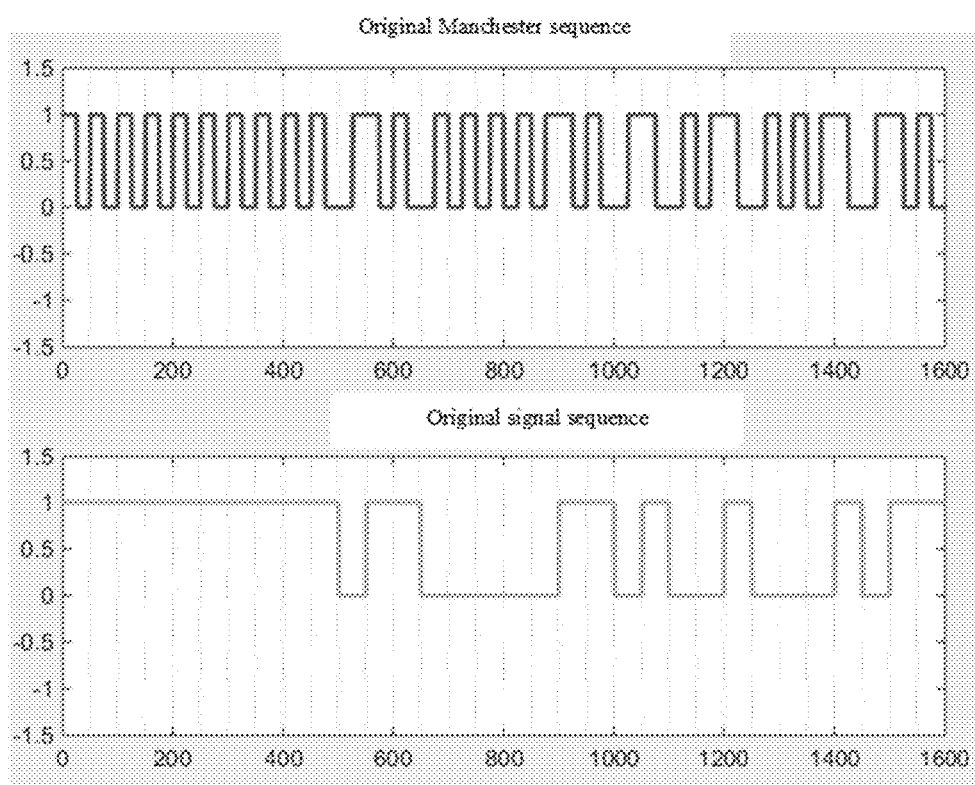
FIG. 8 is a schematic diagram of decoding an original Manchester sequence to obtain original data.

FIG. 8 shows a process of decoding an original Manchester sequence to obtain original data. FIG. 8a shows a schematic diagram of the original Manchester sequence; and FIG. 8b shows a schematic diagram of the original data.

It should be understood that the foregoing Manchester sequences are used as a form of coding sequence and it is merely illustrative and shall not limit the present disclosure in any way, and the present disclosure shall not be limited thereto. For example, the coding sequence may also be a sequence obtained by encoding by means of another encoding method.

It should also be understood that the first preset value is "1", the second preset value is "0", and the correspondence of the first preset value and the high level listed above are merely illustrative and shall not limit the present disclosure in any way, for example, the first preset value may also be "0" and may further correspond to the high level in the square wave signal, and the second preset value may be "1". The present disclosure is not particularly limited thereto.

Therefore, according to the method of transmitting the signal in the embodiment of the present disclosure, based on the one-to-one mapping relation of the plurality of time interval eigenvalues and the plurality of coding sequences, and the acquired plurality of time interval eigenvalues, the corresponding coding sequence can be determined, thereby recovering the original data. The use of a complex digital circuit in the prior art to decode is avoided, such that a digital circuit structure is simplified, thereby reducing the cost.

The method of transmitting the signal according to the embodiment of the present disclosure is described in detail with reference to FIGS. 1 to 8. Hereinafter, an apparatus of transmitting a signal according to an embodiment of the present disclosure will be described in detail with reference to FIGS. 9 and 12.

Figure 9:
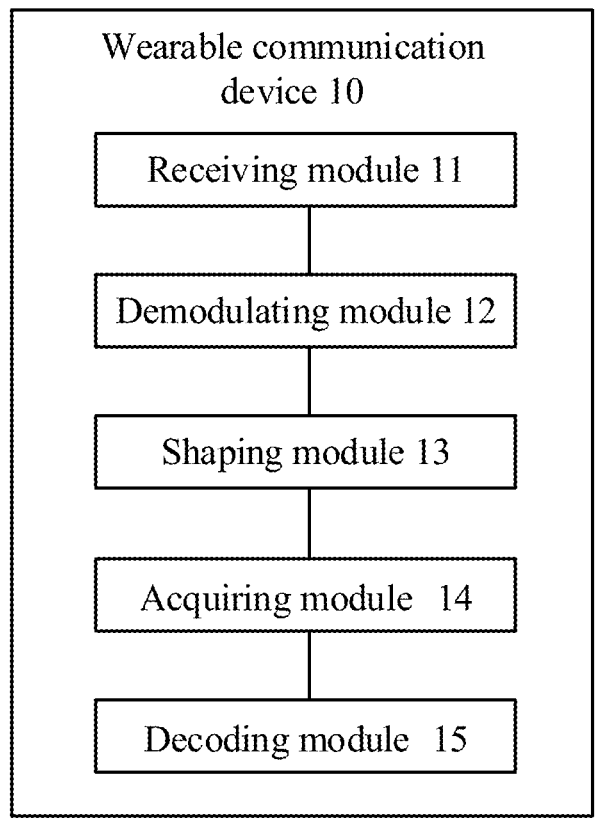
FIG. 9 is a schematic block diagram of a wearable communication device according to an embodiment of the present disclosure.

FIG. 9 is a schematic block diagram of a wearable communication device 10 according to an embodiment of the present disclosure. As shown in FIG. 9, the wearable communication device 10 includes:

a receiving module 11, configured to receive a modulated wave signal transmitted by a terminal device, where the modulated wave signal is a signal obtained after the terminal device encodes and modulates original data;

a demodulating module 12, configured to demodulate the received modulated wave signal to obtain a to-be-decoded signal;

a shaping module 13, configured to perform a waveform shaping process on the to-be-decoded signal to obtain a square wave signal, where a high level in the square wave signal is used to represent a first preset value, and high levels in the square wave signal corresponding to any two adjacent first preset values have a time interval;

an acquiring module 14, configured to acquire a plurality of time interval eigenvalues in the square wave signal;

the acquisition module 14 further configured to acquire a first mapping relation, where the first mapping relation is used to indicate a one-to-one mapping relation of the plurality of time interval eigenvalues and a plurality of coding sequences;

a decoding module 15, configured to perform a first decoding process on the square wave signal to obtain an original coding sequence according to the plurality of time interval eigenvalues and the first mapping relation, where the original coding sequence is obtained by encoding the original data by the terminal device; and the decoding module 15 further configured to perform a second decoding process on the original coding sequence to obtain the original data.

Optionally, the wearable communication device 10 further includes:

a processing module, configured to set a packet header signal to the modulated wave signal;

the acquisition module 14 further configured to acquire a period of the packet header signal, a pulse width of the modulated wave signal, and an edge deviation between a rising edge or a falling edge of the square wave and a pulse starting point of the modulated wave signal when a threshold outputted from a comparator is greater than zero according to the packet header signal, where the comparator is configured to perform the waveform shaping process on the modulated wave signal; and the acquiring module 14 configured to acquire the plurality of time interval eigenvalues according to the period of the packet header signal, the pulse width, and the edge deviation.

Optionally, the plurality of time interval eigenvalues includes: a first eigenvalue, a second eigenvalue and a third eigenvalue, the plurality of coding sequences include a first Manchester sequence, a second Manchester sequence and a third Manchester sequence, where each coding sequence includes a second preset value and the first preset value, the square wave signal is used to represent the first preset value and the second preset value, the first mapping relation includes:

the first eigenvalue corresponding to the first Manchester sequence, where the first Manchester sequence is: a value of a first bit being the first preset value and a value of a second bit being the second preset value;

the second eigenvalue corresponding to the second Manchester sequence, where the second Manchester sequence is: a value of the first bit being the first preset value, a value of the second bit being the second preset value, and a value of a third bit being the second preset value;

the third eigenvalue corresponding to the third Manchester sequence, where the third Manchester sequence is: a value of the first bit being the first preset value and a value of the second bit being the second preset value; and where the time interval eigenvalue is used to characterize a time interval between any two adjacent high levels, the first bit is a bit corresponding to the first high level in two adjacent high levels corresponding to the time interval eigenvalue, the second bit is the next bit after the first bit, and the third bit is the next bit after the second bit.

Optionally, when a first decoding process is performed on the square wave signal according to the plurality of time interval eigenvalues and the first mapping relation, the decoding module 15 is configured to perform a decoding process on the square wave signal to obtain a decoding result according to the plurality of time interval eigenvalues and the first mapping relation, where the decoding result includes the at least one first Manchester sequence, the at least one second Manchester sequence and the at least one third Manchester sequence; and the decoding module is configured to perform a recovering process on the decoding result to obtain the original Manchester sequence according to a bit included in the decoding result. Optionally, the decoding result is a Manchester sequence including S bits, S is a natural number greater than or equal to 2, and when the recovering process is performed on the decoding result, the decoding module 15 is configured to determine values of the last two bits of the original data according to a waveform in the square wave signal corresponding to the last two bits of the original Manchester sequence if mod (S, 2)=0; or if mod (S, 2)=1, determining values of the last two bits of the original data according to a waveform in the square wave signal corresponding to the second last bit of the original Manchester sequence; and the decoding module 15 is configured to determine the original Manchester sequence according to the decoding result and the values of the last two bits of the original Manchester sequence.

Optionally, the receiving module 11 is configured to receive the modulated wave signal transmitted by the terminal device through a first channel line;

the receiving module 11 is further configured to receive a carrier signal transmitted by the terminal device through a second channel line, where the carrier signal is configured to modulate the original coding sequence to obtain the modulated wave signal; and the demodulating module 15 is configured to demodulate the modulated wave signal to obtain the to-be-decoded signal based on the carrier signal.

Optionally, the carrier signal is obtained by performing an amplitude modulation on a sine wave of a first frequency and a sine wave of a second frequency, and a frequency difference between the first frequency and the second frequency is greater than or equal to 20 kHz.

Optionally, the wearable communication device 10 is a wired earphone.

The wearable communication device 10 according to the embodiment of the present disclosure may correspond to the wearable communication device in the method of transmitting the signal according to the embodiment of the present disclosure, and modules in the wearable communication device 10 and the forgoing another operation and/or function are intended to implement the corresponding process of the method in FIG. 1 respectively, and will not repeatedly described here for brevity.

Therefore, the wearable communication device can determine the corresponding coding sequence according to the one-to-one mapping relation of the plurality of time interval eigenvalues and the plurality of coding sequences and the acquired plurality of time interval eigenvalues, thereby recovering the original data. The use of a complex digital circuit in the prior art to decode is avoided, such that a digital circuit structure is simplified, thereby reducing the cost.

Figure 10:
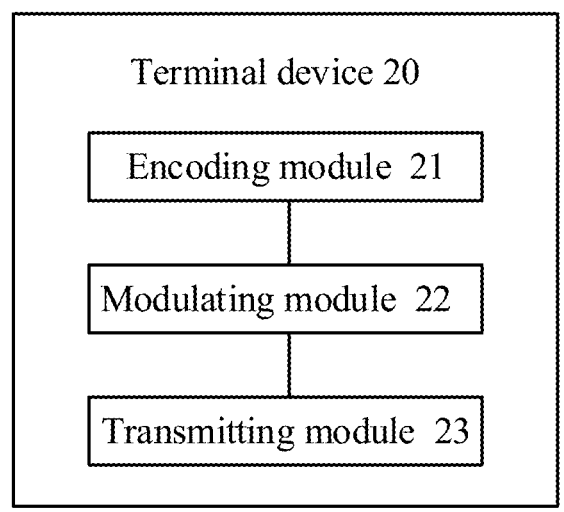
FIG. 10 is a schematic block diagram of a terminal device according to an embodiment of the present disclosure.

FIG. 10 is a schematic block diagram of a terminal device 20 according to an embodiment of the present disclosure. As shown in FIG. 10, the terminal device 20 includes:

an encoding module 21, configured to encode original data to obtain an original coding sequence;

a modulating module 22, configured to modulate the original coding sequence to obtain a modulated wave signal; and a transmitting module 23, configured to transmit the modulated wave signal to a wearable communication device.

Optionally, the modulating module 22 is further configured to modulate a sine wave of a first frequency and a sine wave of a second frequency to obtain a carrier signal, where a frequency difference between the first frequency and the second frequency is greater than or equal to 20 kHz; and the modulating module 22 is configured to perform an ASK modulation on the original coding sequence to obtain the modulated wave signal based on the carrier signal.

Optionally, the transmitting module 23 is configured to transmit the modulated wave signal to the wearable communication device through a first channel line;

the transmitting module 23 is further configured to transmit the carrier signal to the wearable communication device through a second channel line, where the carrier signal is configured to demodulate the received modulated wave signal by the wearable communication device to obtain a to-be-decoded signal.

Optionally, the wearable communication device is a wired earphone.

The terminal device 20 according to the embodiment of the present disclosure may correspond to the terminal device in the method of transmitting the signal according to the embodiment of the present disclosure, and modules in the terminal device 20 and the forgoing another operation and/or function are intended to implement the corresponding process of the method in FIG. 1 respectively, and will not repeatedly described here for brevity.

Therefore, the corresponding coding sequence can be determined according to the one-to-one mapping relation of the plurality of time interval eigenvalues and the plurality of coding sequences and the acquired plurality of time interval eigenvalues, thereby recovering the original data. The use of a complex digital circuit in the prior art to decode can be avoided, such that a digital circuit structure is simplified, thereby reducing the cost.

Figure 11:
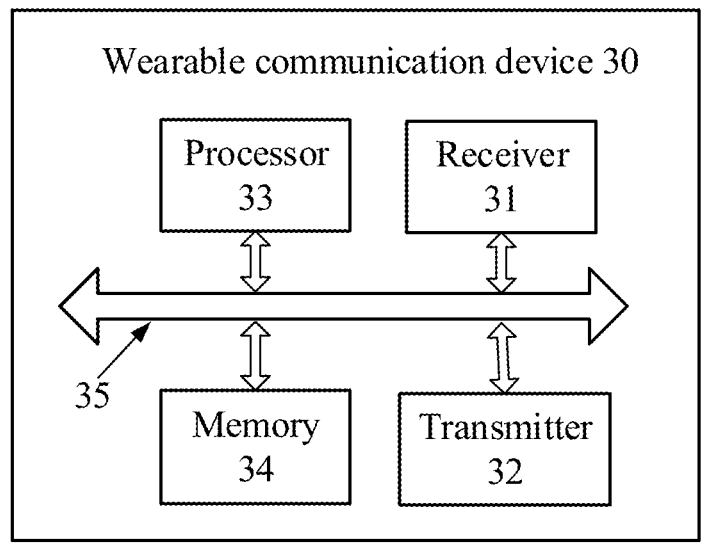
FIG. 11 is another schematic block diagram of a wearable communication device according to an embodiment of the present disclosure.

FIG. 11 is another schematic block diagram of a wearable communication device 30 according to an embodiment of the present disclosure. As shown in FIG. 11, the wearable communication device 30 includes: a receiver 31, a transmitter 32, a processor 33, a memory 34, and a bus system 35. The receiver 31, the transmitter 32, the processor 33, and the memory 34 are connected via the bus system 35, the memory 34 is configured to store instructions, the processor 33 is configured to execute instructions stored in the memory 34 to control the receiver 31 to receive a signal and to control the transmitter 32 to transmit a signal.

The receiver 31 is configured to receive a modulated wave signal transmitted by a terminal device, where the modulated wave signal is a signal obtained after the terminal device encodes and modulates original data;

the processor 33 is configured to demodulate the received modulated wave signal to obtain a to-be-decoded signal;

the processor 33 is configured to perform a waveform shaping process on the to-be-decoded signal to obtain a square wave signal, where a high level in the square wave signal is used to represent a first preset value, and high levels in the square wave signal corresponding to any two adjacent first preset values have a time interval;

the processor 33 is further configured to acquire a plurality of time interval eigenvalues in the square wave signal;

the processor 33 is further configured to acquire a first mapping relation, where the first mapping relation is used to indicate a one-to-one mapping relation of the plurality of time interval eigenvalues and a plurality of coding sequences;

the processor 33 is further configured to perform a first decoding process on the square wave signal to obtain an original coding sequence according to the plurality of time interval eigenvalues and the first mapping relation, where the original coding sequence is obtained by encoding the original data by the terminal device; and the processor 33 is further configured to perform a second decoding process on the original coding sequence to obtain the original data.

It should be understood that, the processor in this embodiment of the present disclosure may be an integrated circuit chip, and has a signal processing capability. In an implementation process, each step of the foregoing method embodiments may be completed through an integrated logic circuit of hardware or instructions in a software form in the processor. The foregoing processor may be a CPU, and the foregoing processor may also be other general processor, a digital signal processor (DSP), an application specific integrated circuit (ASIC), a field programmable gate array (FPGA) or other programmable logic devices, a discrete gate or transistor logic device, a discrete hardware component, or the like. Each method, step and logical block disclosed in embodiments of the present disclosure may be implemented or executed. The general processor may be a microprocessor, or the processor may also be any common processor or the like. The steps of the method disclosed in the embodiments of the present disclosure may be directly performed by a hardware decoding processor, or performed by using a combination of a hardware module and a software module in a decoding processor. The software module may be located in a storage medium mature in the art, such as a random access memory, a flash memory, a read-only memory, a programmable read-only memory, an electrically erasable programmable memory, or a register. The storage medium is located in the memory, the processor reads the information in the memory, and completes the steps of the forgoing method in conjunction with its hardware.

It should also be understood that the memory in the embodiments of the present disclosure may be a volatile memory or a nonvolatile memory, or may include both volatile and nonvolatile memory. The nonvolatile memory may be a read-only memory (ROM), a programmable ROM (PROM), an erasable PROM (EPROM), an electrically EPROM (EEPROM), or a flash memory. The volatile memory may be a random access memory (RAM), which is used as an external cache. By way of illustration but not limitation, numerous forms of RAM are available, for example, a static RAM (SRAM), a dynamic RAM (DRAM), a synchronous DRAM, (SDRAM), a double data rate SDRAM (DDR SDRAM), an enhanced SDRAM (ES-DRAM), a synch link DRAM (SLDRAM) and a direct Rambus RAM (DR RAM). It should be noted that the memory of the system and method described herein is intended to include, but not be limited to, any other suitable type of memory.

It should also be understood that the bus system may include a power bus, a control bus, and a status signal bus in addition to the data bus. However, for clarity, various buses are denoted as bus system in a figure.

In an implementation process, each step of the foregoing method may be completed through an integrated logic circuit of hardware or instructions in a software form in the processor. The steps of the locating method disclosed in the embodiments of the present disclosure may be directly performed by a hardware processor, or performed by using a combination of a hardware module and a software module in a processor. The software module may be located in a storage medium mature in the art, such as a random access memory, a flash memory, a read-only memory, a programmable read-only memory, an electrically erasable programmable memory, or a register. The storage medium is located in the memory, the processor reads the information in the memory, and completes the steps of the forgoing method in conjunction with its hardware. It will not be described in detail herein to avoid repetition.

Optionally, the processor 33 is configured to set a packet header signal to the modulated wave signal;

the processor 33 is further configured to acquire a period of the packet header signal, a pulse width of the modulated wave signal, and an edge deviation between a rising edge or a falling edge of the square wave and a pulse starting point of the modulated wave signal when a threshold outputted from a comparator is greater than zero according to the packet header signal, where the comparator is configured to perform the waveform shaping process on the modulated wave signal; and the processor 33 is configured to acquire the plurality of time interval eigenvalues according to the period of the packet header signal, the pulse width, and the edge deviation.

Optionally, the plurality of time interval eigenvalues includes: a first eigenvalue, a second eigenvalue and a third eigenvalue, the plurality of coding sequences include a first Manchester sequence, a second Manchester sequence and a third Manchester sequence, where each coding sequence includes a second preset value and the first preset value, the square wave signal is used to represent the first preset value and the second preset value, the first mapping relation includes:

the first eigenvalue corresponding to the first Manchester sequence, where the first Manchester sequence is: a value of a first bit being the first preset value and a value of a second bit being the second preset value;

the second eigenvalue corresponding to the second Manchester sequence, where the second Manchester sequence is: a value of the first bit being the first preset value, a value of the second bit being the second preset value, and a value of a third bit being the second preset value;

the third eigenvalue corresponding to the third Manchester sequence, where the third Manchester sequence is: a value of the first bit being the first preset value and a value of the second bit being the second preset value; and where the time interval eigenvalue is used to characterize a time interval between any two adjacent high levels, the first bit is a bit corresponding to the first high level in two adjacent high levels corresponding to the time interval eigenvalue, the second bit is the next bit after the first bit, and the third bit is the next bit after the second bit.

Optionally, when a first decoding process is performed on the square wave signal according to the plurality of time interval eigenvalues and the first mapping relation, the processor 33 is configured to perform a decoding process on the square wave signal to obtain a decoding result according to the plurality of time interval eigenvalues and the first mapping relation, where the decoding result includes the at least one first Manchester sequence, the at least one second Manchester sequence and the at least one third Manchester sequence; and the decoding module is configured to perform a recovering process on the decoding result to obtain the original Manchester sequence according to a bit included in the decoding result, the original Manchester sequence being a sequence obtained by encoding the original data.

Optionally, the decoding result is a Manchester sequence including S bits, S is a natural number greater than or equal to 2, when the recovering process is performed on the decoding result, the processor 33 is configured to determine values of the last two bits of the original data according to a waveform in the square wave signal corresponding to the last two bits of the original Manchester sequence if mod (S, 2)=0; or determining values of the last two bits of the original data according to a waveform in the square wave signal corresponding to the second last bit of the original Manchester sequence if mod (S, 2)=1; and the processor 33 is configured to determine the original Manchester sequence according to the decoding result and the values of the last two bits of the original Manchester sequence.

Optionally, the receiver 31 is configured to receive the modulated wave signal transmitted by the terminal device through a first channel line;

the receiver 31 is further configured to receive a carrier signal transmitted by the terminal device through a second channel line, where the carrier signal is configured to modulate the original coding sequence to obtain the modulated wave signal; and the processor 33 is configured to demodulate the modulated wave signal to obtain the to-be-decoded signal based on the carrier signal.

Optionally, the carrier signal is obtained by performing an amplitude modulation on a sine wave of a first frequency and a sine wave of a second frequency, and a frequency difference between the first frequency and the second frequency is greater than or equal to 20 kHz.

Optionally, the wearable communication device 30 is a wired earphone.

The wearable communication device 30 according to the embodiment of the present disclosure may correspond to the wearable communication device in the method of transmitting the signal according to the embodiment of the present disclosure, and modules in the wearable communication device 30 and the forgoing another operation and/or function are intended to implement the corresponding process of the method in FIG. 1 respectively, and will not repeatedly described here for brevity.

Therefore, the wearable communication device can determine the corresponding coding sequence according to the one-to-one mapping relation of the plurality of time interval eigenvalues and the plurality of coding sequences, and the acquired plurality of time interval eigenvalues, thereby recovering the original data. The use of a complex digital circuit in the prior art to decode is avoided, such that a digital circuit structure is simplified, thereby reducing the cost.

Figure 12:
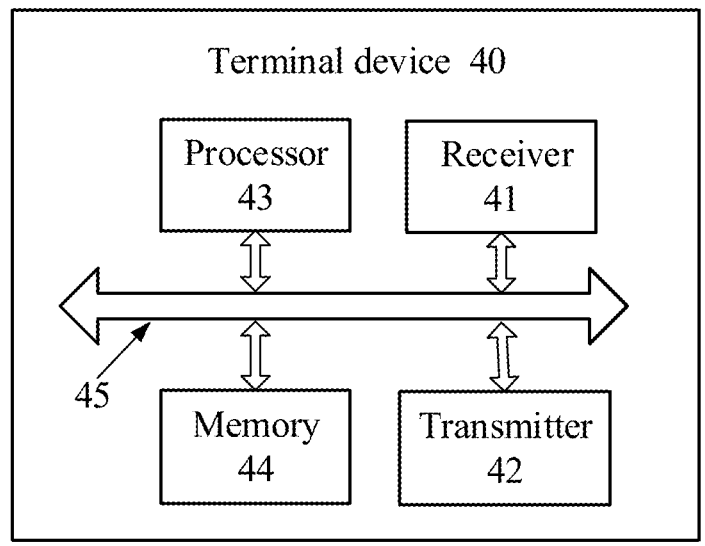
FIG. 12 is another schematic block diagram of a terminal device according to an embodiment of the present disclosure.

FIG. 12 is another schematic block diagram of a terminal device 40 according to an embodiment of the present disclosure. As shown in FIG. 12, the terminal device 40 includes: a receiver 41, a transmitter 42, a processor 43, a memory 44, and a bus system 45. The receiver 41, the transmitter 42, the processor 43, and the memory 44 are connected via the bus system 45, the memory 44 is configured to store instructions, the processor 43 is configured to execute instructions stored in the memory to control the receiver 41 to receive a signal and to control the transmitter 42 to transmit a signal.

The processor 43 is configured to modulate the original coding sequence to obtain a modulated wave signal; and The transmitter 42 is configured to transmit the modulated wave signal to a wearable communication device.

Optionally, the processor 43 is further configured to modulate a sine wave of a first frequency and a sine wave of a second frequency to obtain a carrier signal, where a frequency difference between the first frequency and the second frequency is greater than or equal to 20 kHz; and the processor 43 is configured to perform an ASK modulation on the original coding sequence to obtain the modulated wave signal based on the carrier signal.

Optionally, a transmitter 42 is configured to transmit the modulated wave signal to a wearable communication device through a first channel line;

the transmitter 42 is further configured to transmit the carrier signal to the wearable communication device through a second channel line, where the carrier signal is configured to demodulate the received modulated wave signal by the wearable communication device to obtain a to-be-decoded signal.

Optionally, the wearable communication device is a wired earphone.

The terminal device 40 according to the embodiment of the present disclosure may correspond to the terminal device in the method of transmitting the signal according to the embodiment of the present disclosure, and modules in the terminal device 40 and the forgoing another operation and/or function are intended to implement the corresponding process of the method in FIG. 1 respectively, and will not repeatedly described here for brevity.

Therefore, the corresponding coding sequence can be determined according to the one-to-one mapping relation of the plurality of time interval eigenvalues and the plurality of coding sequences and the acquired plurality of time interval eigenvalues, thereby recovering the original data. The use of a complex digital circuit in the prior art to decode is avoided, such that the digital circuit structure is simplified, thereby reducing the cost.

It should be understood that in the various embodiments of the present disclosure, sequence numbers of the foregoing processes do not mean the execution sequence, and the sequence of executing the respective processes should be determined in terms of their functions and intrinsic logic, and shall not limit the embodiment of the present disclosure in any way.

Persons of ordinary skill in the art may be aware that, the exemplary units and algorithm steps described in combination with the embodiments disclosed here can be implemented by electronic hardware or a combination of computer software and electronic hardware. Whether the functions are executed in a manner of hardware or software depends on a particular application and a design constraint condition of the technical solutions. Persons skilled in the art may use different methods to implement the described functions for every particular application, but it should not be considered that such implementation goes beyond the scope of the present disclosure.

Persons skilled in the art may clearly understand that, for convenience and brevity of description, reference may be made to the corresponding procedure in the foregoing method embodiments for a detailed working procedure of the foregoing system, apparatus and unit, which is not repeatedly described here.

In the several embodiments provided in the present application, it should be understood that the disclosed system, apparatus, and method may be implemented in other manners. For example, the foregoing described apparatus embodiments are merely exemplary. For example, division of the units is merely logical function division and there may be other division manners in practical implementation. For example, multiple units or components may be combined or integrated into another system, or some features may be ignored or not executed. In addition, the displayed or discussed mutual coupling or direct coupling or communication connection may be indirect coupling or communication connection through some interfaces, apparatuses or units, and may also be electrical, mechanical, or connection in other forms.

The units described as separate parts may or may not be physically separate, and parts displayed as units may or may not be physical units, may be located in one position, or may be distributed on multiple network units. Part of or all of the units here may be selected according to a practical need to achieve the objectives of the solutions of the embodiments of the present disclosure.

In addition, functional units in the embodiments of the present disclosure may be integrated into a processing unit, or each unit may exist alone physically, or two or more than two units may be integrated into one unit. The integrated unit may be implemented in a form of hardware, or may be implemented in a form of a software functional unit.

If being implemented in the form of a software functional unit and sold or used as a separate product, the integrated unit may be stored in a computer-readable storage medium. Based on such understanding, the nature of the technical solutions of the present disclosure, or the part contributing to the prior art, or all of or part of the technical solutions may be implemented in a form of software product. The computer software product is stored in a storage medium and includes several instructions for instructing a computer device (which may be a personal computer, a server, or a network device, and the like) to execute all of or part of the steps of the method described in the embodiments of the present disclosure. The storage medium includes: various media that may store program codes, such as a U-disk, a removable hard disk, a read-only memory (ROM, Read-Only Memory), a random access memory (RAM, Random Access Memory), a magnetic disk, a compact disk, and so on.

The foregoing description is only a specific embodiment of the present disclosure. The protection scope of the present disclosure, however, is not limited here. Various modifications or replacements may be readily conceivable to any person skilled in the art within the technical scope disclosed in the present disclosure, and such modifications or replacements shall fall within the protection scope of the present disclosure. Therefore, the protection scope of the present disclosure shall be subject to the protection scope of the claims.

What is claimed is:

1. A method of transmitting a signal, comprising:
   receiving, by a wearable communication device, a modulated wave signal transmitted by a terminal device, wherein the modulated wave signal is obtained by modulating original data by the terminal device;
   demodulating the modulated wave signal to obtain a to-be-decoded signal;
   performing a waveform shaping process on the to-be-decoded signal to obtain a square wave signal, wherein a high level in the square wave signal is configured to represent a first preset value, and a time interval is existed between two high levels in the square wave signal corresponding to any two adjacent first preset values;
   acquiring a plurality of time interval eigenvalues in the square wave signal;
   acquiring a first mapping relation, wherein the first mapping relation is configured to indicate a one-to-one mapping relation of the plurality of time interval eigenvalues and a plurality of coding sequences;
   performing, according to the plurality of time interval eigenvalues and the first mapping relation, a first decoding process on the square wave signal to obtain an original coding sequence, wherein the original coding sequence is obtained by encoding the original data by the terminal device; and
   performing a second decoding process on the original coding sequence to obtain the original data.

2. The method according to claim 1, wherein acquiring the plurality of time interval eigenvalues in the square wave signal, comprises:
   setting a packet header signal to the modulated wave signal;
   acquiring a period of the packet header signal, a pulse width of the modulated wave signal, and an edge deviation between a rising edge or a falling edge of each square wave in the square wave signal and a pulse starting point of the modulated wave signal when a threshold outputted from a comparator is greater than zero according to the packet header signal, wherein the comparator is configured to perform the waveform shaping process on the modulated wave signal; and
   acquiring the plurality of time interval eigenvalues according to the period of the packet header signal, the pulse width and the edge deviation.

3. The method according to claim 1, wherein the plurality of time interval eigenvalues comprises: a first eigenvalue, a second eigenvalue and a third eigenvalue, the plurality of coding sequences comprise a first Manchester sequence, a second Manchester sequence and a third Manchester sequence, wherein each coding sequence comprises a second preset value and the first preset value, the square wave signal is configured to represent the first preset value and the second preset value,
   the first mapping relation comprises:
   the first eigenvalue corresponding to the first Manchester sequence, wherein a value of a first bit of the first Manchester sequence is the first preset value and a value of a second bit of the first Manchester sequence is the second preset value;
   the second eigenvalue corresponding to the second Manchester sequence, wherein a value of a first bit of the second Manchester sequence is the first preset value, a value of a second bit of the second Manchester sequence is the second preset value, and a value of a third bit of the second Manchester sequence is the second preset value;
   the third eigenvalue corresponding to the third Manchester sequence, wherein a value of a first bit of the third Manchester sequence is the first preset value and a value of a second bit of the third Manchester sequence is the second preset value; and
   wherein the time interval eigenvalue is configured to characterize the time interval between any two adjacent high levels, the first bit is a bit corresponding to a first high level in the two adjacent high levels corresponding to the time interval eigenvalue, the second bit is the next bit after the first bit, and the third bit is the next bit after the second bit.

4. The method according to claim 3, wherein the original coding sequence is an original Manchester sequence obtained by performing a Manchester coding on the original data, and
   wherein performing, according to the plurality of time interval eigenvalues and the first mapping relation, the first decoding process on the square wave signal to obtain the original coding sequence, comprises:
   decoding, according to the plurality of time interval eigenvalues and the first mapping relation, the square wave signal to obtain a decoding result, wherein the decoding result comprises at least one first Manchester sequence, at least one second Manchester sequence and at least one third Manchester sequence; and
   performing, according to bits comprised in the decoding result, a recovering process on the decoding result to obtain the original Manchester sequence.

5. The method according to claim 4, wherein the decoding result is a Manchester sequence comprising S bits, S is a natural number greater than or equal to 2, and wherein performing, according to the bits comprised in the decoding result, the recovering process on the decoding result to obtain the original Manchester sequence, comprises:
if mod (S, 2)=0, determining values of the last two bits of the original data according to a waveform in the square wave signal corresponding to the last two bits of the original Manchester sequence; or
if mod (S, 2)=1, determining values of the last two bits of the original data according to a waveform in the square wave signal corresponding to the second last bit of the original Manchester sequence; and
determining the original Manchester sequence according to the decoding result and the values of the last two bits of the original Manchester sequence.

6. The method according to claim 1, wherein receiving, by the wearable communication device, the modulated wave signal transmitted by the terminal device, comprises:
receiving, by the wearable communication device, the modulated wave signal transmitted by the terminal device through a first channel line;
wherein demodulating the received modulated wave signal to obtain the to-be-decoded signal, comprises:
receiving a carrier signal transmitted by the terminal device through a second channel line, wherein the carrier signal is configured to modulate the original coding sequence to obtain the modulated wave signal; and
demodulating, based on the carrier signal, the modulated wave signal to obtain the to-be-decoded signal.

7. The method according to claim 6, wherein the carrier signal is obtained by performing an amplitude modulation on a sine wave of a first frequency and a sine wave of a second frequency, and a frequency difference between the first frequency and the second frequency is greater than or equal to 20 kHz.

8. The method according to claim 1, wherein the wearable communication device is a wired earphone.

9. A wearable communication device, comprising:
a receiving module, configured to receive a modulated wave signal transmitted by a terminal device, wherein the modulated wave signal is obtained by modulating original data by the terminal device;
a demodulating module, configured to demodulate the modulated wave signal to obtain a to-be-decoded signal;
a shaping module, configured to perform a waveform shaping process on the to-be-decoded signal to obtain a square wave signal, wherein a high level in the square wave signal is configured to represent a first preset value, and a time interval is existed between high levels in the square wave signal corresponding to any two adjacent first preset values;
an acquisition module, configured to acquire a plurality of time interval eigenvalues in the square wave signal;
the acquiring module further configured to acquire a first mapping relation, wherein the first mapping relation is configured to indicate a one-to-one mapping relation of the plurality of time interval eigenvalues and a plurality of coding sequences;
a decoding module, configured to perform a first decoding process on the square wave signal to obtain an original coding sequence according to the plurality of time interval eigenvalues and the first mapping relation, wherein the original coding sequence is obtained by encoding the original data by the terminal device; and
the decoding module further configured to perform a second decoding process on the original coding sequence to obtain the original data.

10. The wearable communication device according to claim 9, wherein the wearable communication device further comprises:
a processing module, configured to set a packet header signal to the modulated wave signal;
the acquiring module further configured to acquire a period of the packet header signal, a pulse width of the modulated wave signal, and an edge deviation between a rising edge or a falling edge of each square wave in the square wave signal and a pulse starting point of the modulated wave signal when a threshold outputted from a comparator is greater than zero according to the packet header signal, wherein the comparator is configured to perform the waveform shaping process on the modulated wave signal; and
the acquiring module configured to acquire the plurality of time interval eigenvalues according to the period of the packet header signal, the pulse width, and the edge deviation.

11. The wearable communication device according to claim 9, wherein the plurality of time interval eigenvalues comprise: a first eigenvalue, a second eigenvalue and a third eigenvalue, the plurality of coding sequences comprise a first Manchester sequence, a second Manchester sequence and a third Manchester sequence, wherein each coding sequence comprises a second preset value and the first preset value, the square wave signal is configured to represent the first preset value and the second preset value,
the first mapping relation comprises:
the first eigenvalue corresponding to the first Manchester sequence, wherein a value of a first bit of the first Manchester sequence is the first preset value and a value of a second bit of the first Manchester sequence is the second preset value;
the second eigenvalue corresponding to the second Manchester sequence, wherein a value of a first bit of the second Manchester sequence is the first preset value, a value of a second bit of the second Manchester sequence is the second preset value, and a value of a third bit of the second Manchester sequence is the second preset value;
the third eigenvalue corresponding to the third Manchester sequence, wherein a value of a first bit of the third Manchester sequence is the first preset value and a value of a second bit of the third Manchester sequence is the second preset value; and
wherein the time interval eigenvalue is configured to characterize the time interval between any two adjacent high levels, the first bit is a bit corresponding to a first high level in the two adjacent high levels corresponding to the time interval eigenvalue, the second bit is the next bit after the first bit, and the third bit is next bit after the second bit.

12. The wearable communication device according to claim 11, wherein the original coding sequence is an original Manchester sequence obtained by performing a Manchester coding on the original data, and
the decoding module is configured to perform a decoding process on the square wave signal to obtain a decoding result according to the plurality of time interval eigenvalues and the first mapping relation, wherein the decoding result comprises at least one first Manchester sequence, at least one second Manchester sequence and at least one third Manchester sequence; and the decoding module is configured to perform a recovering process on the decoding result to obtain the original Manchester sequence according to bits comprised in the decoding result.

13. The wearable communication device according to claim 12, wherein the decoding result is a Manchester sequence comprising S bits, S is a natural number greater than or equal to 2, the decoding module is configured to determine values of the last two bits of the original data according to a waveform in the square wave signal corresponding to the last two bits of the original Manchester sequence if mod (S, 2)=0; or determine values of the last two bits of the original data according to a waveform in the square wave signal corresponding to the second last bit of the original Manchester sequence if mod (S, 2)=1; and the decoding module is configured to determine the original Manchester sequence according to the decoding result and the values of the last two bits of the original Manchester sequence.

14. The wearable communication device according to claim 9, wherein the receiving module is configured to receive the modulated wave signal transmitted by the terminal device through a first channel line;

the receiving module is further configured to receive a carrier signal transmitted by the terminal device through a second channel line, wherein the carrier signal is configured to modulate the original coding sequence to obtain the modulated wave signal; and the demodulating module is configured to demodulate the modulated wave signal to obtain the to-be-decoded signal based on the carrier signal.

15. The wearable communication device according to claim 14, wherein the carrier signal is obtained by performing an amplitude modulation on a sine wave of a first frequency and a sine wave of a second frequency, and a frequency difference between the first frequency and the second frequency is greater than or equal to 20 kHz.

16. The wearable communication device according to claim 9, wherein the wearable communication device is a wired earphone.

17. A terminal device, comprising:

an encoding module, configured to encode original data to obtain an original coding sequence;

a modulating module, configured to modulate the original coding sequence to obtain a modulated wave signal, to perform an amplitude modulation on a sine wave of a first frequency and a sine wave of a second frequency to obtain a carrier signal, wherein a frequency difference between the first frequency and the second frequency is greater than or equal to 20 kHz, and to perform an ASK modulation on the original coding sequence to obtain the modulated wave signal based on the carrier signal; and a transmitting module, configured to transmit the modulated wave signal to a wearable communication device through a first channel line; and the transmitting module is further configured to transmit the carrier signal to the wearable communication device through a second channel line, wherein the carrier signal is configured to demodulate the received modulated wave signal by the wearable communication device to obtain a to-be-decoded signal.

18. The terminal device according to claim 17, wherein the wearable communication device is a wired earphone.

* * * * *